United States Patent [19]

Wittlinger

[11] B  4,012,668
[45] Mar. 15, 1977

[54] GROUND FAULT AND NEUTRAL FAULT DETECTION CIRCUIT

[75] Inventor: Harold Allen Wittlinger, Pennington, N.J.

[73] Assignee: RCA Corporation, New York, N.Y.

[22] Filed: Dec. 20, 1974

[21] Appl. No.: 534,915

[44] Published under the second Trial Voluntary Protest Program on March 23, 1976 as document No. B 534,915.

Related U.S. Application Data

[63] Continuation of Ser. No. 368,662, June 11, 1973, abandoned.

[52] U.S. Cl. .................................. 361/44; 361/93
[51] Int. Cl.² .................................... H02H 3/28
[58] Field of Search .................. 317/18 D, 27 R

[56] References Cited

UNITED STATES PATENTS

| | | | |
|---|---|---|---|
| 3,611,035 | 10/1971 | Douglas | 317/18 D |
| 3,638,072 | 1/1972 | Kobayashi et al. | 317/18 D |
| 3,713,003 | 1/1973 | Benham | 317/18 D |
| 3,732,463 | 5/1973 | Dale | 317/18 D |
| 3,772,569 | 11/1973 | Wible | 317/18 D |
| 3,800,189 | 3/1974 | Montz | 317/18 D |

*Primary Examiner*—James D. Trammell
*Attorney, Agent, or Firm*—Edward J. Norton; William Squire

[57] ABSTRACT

A circuit is disclosed for detecting ground faults and neutral faults and for providing power interruption in response thereto. The circuit monitors the current flow in the line and neutral conductors and provides a signal to a power interruption circuit in the event that a ground fault or a neutral fault condition is detected. In addition, a signal having a certain frequency is generated and coupled on the neutral line to enhance the probability of detecting neutral faults.

3 Claims, 1 Drawing Figure

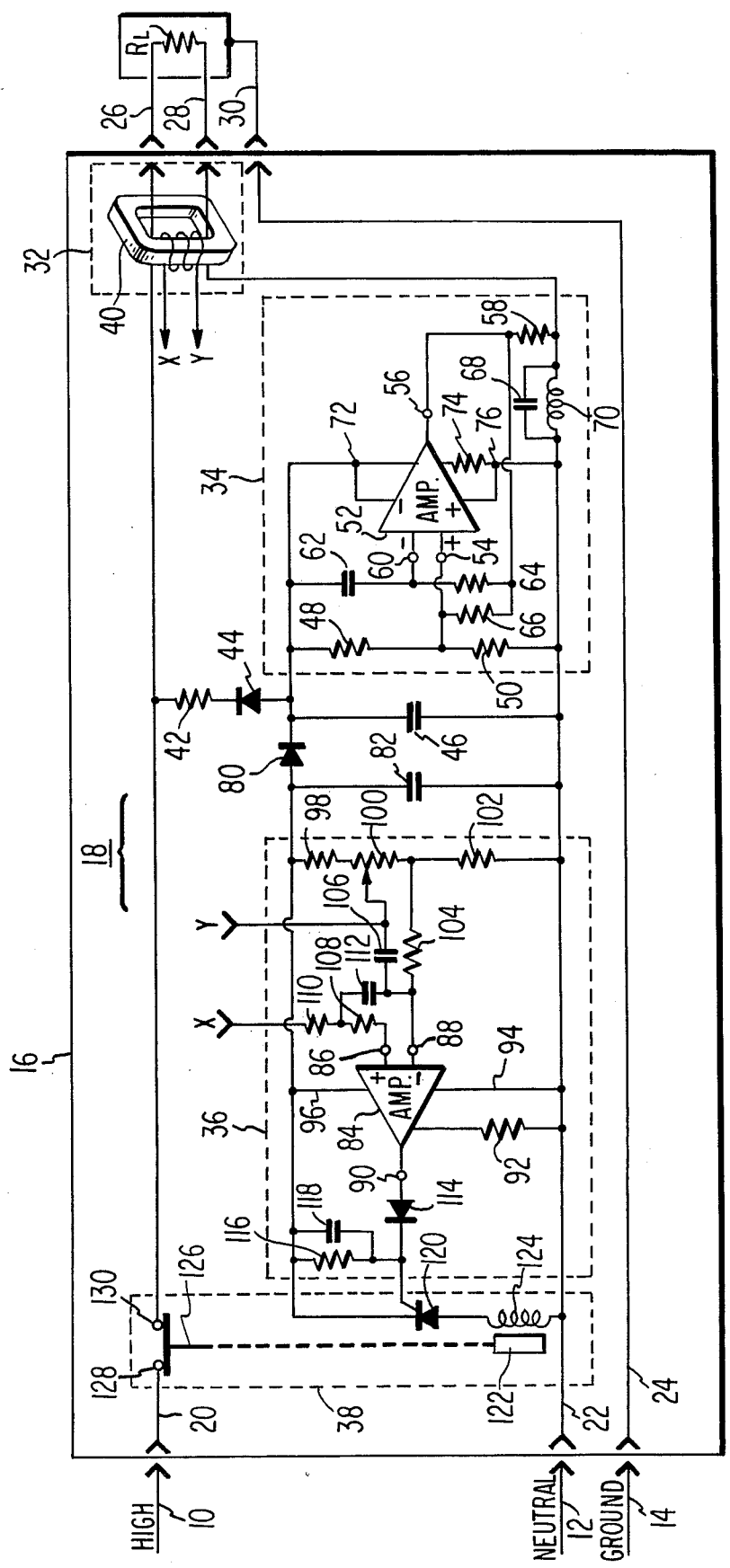

GROUND FAULT AND NEUTRAL FAULT DETECTION CIRCUIT

This is a continuation of application Ser. No. 368,662, filed June 11, 1973, now abandoned.

The present invention relates to a circuit for preventing shock hazards to personnel and more particularly to a circuit having both ground fault and neutral fault protection.

Many common a.c. loads present potential shock hazards to the users thereof. For this reason there has been a good deal of effort expended in attempting to develop circuits and devices for user protection. Typically, the prior art has been concerned with ground fault protection.

At the present time most single phase a.c. electrical outlets are provided with three contact points coupled respectively to: (a) the line bus; (b) the neutral bus; and (c) the ground bus. A load, such as an electrical drill, has a plug with three contacts. The drill motor is placed across the line and neutral conductors and the drill case is connected to the ground conductor. A ground fault develops when, due to some unforseen circumstance, like insulation breakdown, the line conductor is coupled to the ground conductor through a low impedance. When the low impedance is a person's body, serious harm to that person may occur.

The prior art, such as that represented by U.S. Pat. No. 3,668,469, attempts to detect the ground fault situation and then shut off the power to the load so as to prevent harm to the user of the load. Many of the prior art schemes are designed to trip off the line power when a specified difference in current is detected between the line conductor and the neutral conductor. This difference in current may be as high as 5 milliamperes.

A problem arises, however, with the prior art approach, when a neutral fault occurs. A neutral fault occurs when the neutral conductor is connected to the ground conductor via a low impedance. Under these conditions, there may still be some return current flow over the neutral line back to the source and at the same time there may be current flow through the ground conductor. Thus, while there may not be a great enough difference in the flow of current as between the line conductor and the neutral conductor to trip off the power, a person coupled to the ground conductor by holding the chassis or the case of the appliance, may still be subject to having current pass throuh his body. Hence the need arises for a circuit or device which will protect the user of an a.c. load, by shutting off the power, under both ground fault conditions as well as neutral fault conditions.

In some prior art attempts at neutral fault detection, a single turn transformer is placed in the neutral line in order to induce a small signal thereon. The problem here is that in many applications a signal equal in magnitude and opposite in phase to the signal generated by the one turn winding may be developed which results in cancellation of the generated signal and nullifies the effectiveness of the neutral fault circuitry.

The present invention provides a circuit which detects ground faults and neutral faults and interrupts the flow of power to the load when the faults are detected while avoiding the problem of signal cancellation described above.

In accordance with the present invention there is provided first, second and third conductors respectively adapted for connection to an a.c. power distribution system. A signal generating means is provided for placing a signal on the second conductor at a particular frequency. In addition, a monitoring means associated with the first and second conductors is provided for developing a control signal when the current through the first conductor is unequal to the current in the second conductor. A detecting and interruption means, responsive to the control signal is provided for interrupting the flow of power in the first conductor. The control signal is generated in the event of a ground fault or neutral fault in the power system.

In the preferred practice of the present invention, the circuit would be located in the same wall box which houses the electrical outlets found in houses and factories or the like. The particular installation is then part of the power distribution system referred to since the line bus, neutral bus and ground bus are all brought out to each electrical outlet wall box.

IN THE DRAWING

The sole FIGURE in the drawing is a partial block and partial schematic drawing of a preferred embodiment of the present invention.

Referring now to the FIGURE, the a.c. power distribution system, that is, the house or factory wiring, provides a high or line bus 10, a low or neutral bus 12, and a ground bus 14. Buses 10, 12, and 14 are brought out to an electrical outlet box 16 which contains the fault detection and protection circuitry shown generally as 18. Buses 10, 12 and 14 are respectively connected to conductors 20, 22 and 24. Conductors 20, 22 and 24 may be referred to as the line, neutral and ground conductors respectively.

The load to be supplied, $R_L$ is provided with operating power via conductors 26 and 28 which are connected to conductors 20 and 22 respectively. Conductor 30 is connected to the chassis of the load $R_L$ and also to the ground conductor 24. Thus conductors 26, 28 and 30 form the three pronged connection of the load $R_L$ to the wall outlet. The load $R_L$ may be a motor or other appliance such as a small drill, dishwasher or the like.

The circuitry 18 interposed between conductors 10, 12, 14 and 26, 28, 30 is designed to fit within the electrical outlet box. Fault detection and protection circuitry 18 comprises a differential current monitoring transformer 32, an oscillator circuit 34, an amplifier and detection circuit 36, and a power interruption or switching circuit 38.

The transformer in monitoring circuit 32 comprises a core of magnetic material 40 having a ring-like shape. The line conductor 20 and the neutral conductor 22 are passed through the transformer core 40. An electrical conductor having ends x and y is wound around the core 40. Typically, there may be 2,000 turns wound on core 40. Under normal operating conditions, the magnitude of the current flowing into the load $R_L$ on conductors 20 and 26 is equal to the current flowing out of the load $R_L$ on conductors 28 and 22. Thus, there is no net magnetic field generated in the area of the core 40 and therefore there is no induced signal across points x and y.

Oscillator circuit 34 operates on half cycles of the a.c. signal provided on line conductor 20 via resistor 42 and diode 44. Capacitor 46 is connected between the anode electrode of diode 44 and neutral conductor 22 and provides waveform smoothing for the half cycles of a.c. delivered to the oscillator circuit 34. Resistors 48 and 50, which are serially connected in the order named between the anode of diode 44 and conductor 22, provide a d.c. level at a point therebetween for differential amplifier 52. In some applications it may be desirable to provide power to oscillator circuit 34 continuously, that is, even after circuit 38 has been tripped. In this event, resistor 42 and diode 44 would be connected to the power system side of circuit 38.

Amplifier 52 is a commercially available differential amplifier designated as CA3094 and is configured, in circuit 34, as an oscillator to provide an output signal at a frequency of 20 KHz. The output frequency is selected to be non-synchronous with 60 Hz. The point between resistors 48 and 50 is connected to one input terminal 54, the non-inverting input terminal of differential amplifier 52. The output terminal 56 of amplifier 52 is connected to the neutral conductor 22 via a resistor 58. The other input terminal 60 of amplifier 52, the inverting input terminal, is connected to a point between capacitor 62 and resistor 64 which are serially connected in the order named, between the anode of diode 44 and amplifier output terminal 56. Capacitor 62 and resistor 64 are part of a feedback circuit which operates with the circuit described to determine the output frequency of oscillator circuit 34. Feedback is also provided at input terminal 54 via resistor 66 from output terminal 56. Parallel connected capacitor 68 and inductor 70 connected in the neutral line between resistors 58 and 50 also aid in limiting the bandwidth of the pulses from oscillator 34. The additional connections to amplifier 52 including terminal 72, resistor 74 and terminal 76 set the biasing for amplifier 52.

The important point to be noted is that oscillator 34 provides a signal on the neutral line and this signal is low level, on the order of 10–100 millivolts, and is non-synchronous with the frequency of the source.

Power is provided to the amplifier and detection circuit 36 via diode 80. The cathode electrode of diode 80 is connected to the anode electrode of diode 44. In addition, there is provided a relatively large capacitor 82 between the anode electrode of diode 80 and the neutral conductor 22. Capacitor 82 is selected to be large so that circuit 36 is provided with nearly a d.c. level.

The main element in circuit 36 is amplifier 84. Amplifier 84 has a pair of differential input terminals 86 and 88. Terminal 86 is the non-inverting input terminal and terminal 88 is the inverting input terminal. Amplifier 84 has a single ended output terminal 90. Amplifier 84, in the particular application, is commercially available and is designated CA3080. Amplifier 84 is referred to as an operational transconductance amplifier (OTA), because its output signal is best defined in terms of the output current supplied to terminal 90. The output current is proportional to the voltage difference supplied the differential input terminals 86 and 88. The transconductance of the amplifier 84 is directly proportional to the amplifier bias current supplied through resistor 92. Operating potential for amplifier 84 is supplied thereto via conductors 94 and 96. A voltage divider comprising resistors 98, 100 and 102 is connected across capacitor 82. A voltage threshold level is established at terminal 88 via a connection through resistor 104 to a point between resistors 100 and 102. Resistor 100 has a slider arm which is connected to terminal 88 via capacitor 106. Input terminal 86 of amplifier 84 is connected to one end, x, of the winding on the core 40 via resistors 108 and 110. A capacitor 112 is also connected from a point between resistors 108 and 110 and input terminal 88. Capacitors 106 and 112 help to provide filtering for line noise and therefore help to prevent nuisance tripping of the interruption circuit 38. Finally, the other end, y, of the winding on core 40 is connected to the slider arm of resistor 100.

Circuit 36 is one means for amplifying the fault signals provided at points x and y and then utilizing the amplified signal to operate the power interruption circuit 38. Under normal conditions, that is, no signals detected at points x and y, the output terminal 90 of amplifier 84 will sit at a certain d.c. level. This d.c. level is determined by the setting of the slider arm on resistor 100 in the voltage dividing circuit. Once a signal is detected on the points x and y, the d.c. level rises at terminal 90.

The signals provided at terminal 90 are coupled to circuit 38 via diode 114. In addition, the parallel combination of resistor 116 and capacitor 118 is connected from the cathode electrode of diode 114 to the anode electrode of diode 80. Capacitor 118 and resistor 116 are provided to help prevent nuisance tripping of the interruption circuit 38.

Interruption circuit 38 comprises a silicon controlled rectifier (SCR) 120, a magnetically operated relay 122 having an energizing coil 124, an operating arm 126 and contact points 128 and 130.

The cathode electrode of diode 114 is connected to the gate electrode of SCR 120. The coil 124 is connected between the anode electrode of SCR 120 and the neutral conductor 22. The cathode electrode of SCR 120 is connected to the anode electrode of diode 80. The operating arm 126 is normally held in a closed position bridging the gap between contact points 128 and 130 which are serially interposed in the high or line conductor 20.

When a fault signal is delivered to the gate electrode of SCR 120, the device conducts current thereby energizing coil 124. This, in turn, draws down the operating arm 126 and thus interrupts the conduction of power to the load $R_L$.

Looking at the overall operation of the circuit shown in the FIGURE, the following will be noted. First, should the line conductor 26, on the load side, come into conductive contact with conductor 30, i.e. a ground fault, an imbalance will be detected at points x and y. This signal will be amplified by amplifier 84 and the signal at terminal 90 will cause SCR 120 to conduct thereby interrupting conduction between points 128 and 130 on line conductor 20. Second, should the neutral conductor 28, on the load side, come into contact with the ground conductor 30, i.e. a neutral fault, once again an imbalance will result and the power on the line conductor 20 will be interrupted.

In the second situation, the problem of having an opposite phase, equal magnitude signal cancel out the error signal is avoided by virtue of the fact that a low level signal of a frequency which is much higher than the 60 Hz source frequency is provided on the neutral conductor 28.

The important reason for supplying neutral fault protection is that in the prior art it is possible to have a neutral fault condition where a person could touch the high side of the load and have, say, 5 milliamps of current pass through his body. It is then possible that, say 4 milliamps would flow back toward the source over the neutral conductor and 1 milliamp back toward the source over the ground conductor. When looking for a differential signal between the high and neutral lines, as in a differential amplifier, the difference may not be great enough to trip off the power.

In accordance with the present invention, it is the presence or absence of a signal between points $x$ and $y$ which initiates tripping action. Thus, effective neutral fault detection and protection is provided by the present invention in addition to ground fault protection.

What is claimed is:

1. A circuit for detecting neutral faults and ground faults and for providing power interruption in response thereto, said circuit comprising:

first, second and third conductors respectively adapted for connection to the line bus, neutral bus and ground bus of an a.c. power distribution system;

a core of magnetically permeable material having a conductor wound about at least a portion of said core material, said first and second conductors being passed through said core;

a signal generating means for providing a signal at a particular frequency, said particular frequency being asynchronous with respect to the frequency of said a.c. power distribution system, said signal generating means comprising a differential amplifier configured as an oscillator and including means for deriving an operating potential for said differential amplifier from said first conductor;

means for resistively coupling the signal generated by said signal generating means onto said second conductor;

a signal detecting means having a pair of input terminals and an output terminal, said pair of input terminals being connected to the ends of said conductor wound on said core, said signal detecting means further comprising an operational transconductance amplifier and including means for deriving an operating potential for said operational transconductance amplifier from said first conductor; and a line interrupter means connected between said signal detecting means output terminal and said first conductor for interrupting the flow of power through said first conductor in response to the signals generated in said core winding;

said core winding having signals induced therein in the event of a ground fault or a neutral fault in said power distribution system.

2. The circuit according to claim 1 wherein said particular frequency is substantially higher than the power system a.c. frequency.

3. The circuit according to claim 2 wherein said line interrupting means comprises:

a thyristor having two main electrodes and a control electrode, said control electrode being connected to said detecting means output terminal; and a relay having an energizing coil and an operating arm, said energizing coil being connected in series with said thyristor main electrodes, said operating arm being connected in series relation to said first conductor, said operating arm breaking the conductivity of said first conductor in response to signals provided at the output terminal of said detecting means.

* * * * *